United States Patent [19]

Kruger

[11] Patent Number: 5,006,811
[45] Date of Patent: Apr. 9, 1991

[54] DUAL QUADRATURE FREQUENCY CONVERTER

[75] Inventor: Dennis A. Kruger, Tigard, Oreg.

[73] Assignee: TriQuint Semiconductor, Inc., Beaverton, Oreg.

[21] Appl. No.: 472,972

[22] Filed: Jan. 31, 1990

[51] Int. Cl.[5] .............................................. H03D 1/18
[52] U.S. Cl. .................................. 329/354; 329/358; 329/362; 332/152; 332/164; 332/178; 455/325; 455/333
[58] Field of Search ............... 329/354, 356, 358, 360, 329/362; 332/152, 163, 164, 167, 168, 178; 455/209, 323, 325, 326, 327, 328, 333

[56] References Cited

U.S. PATENT DOCUMENTS

| | | | |
|---|---|---|---|
| 3,761,829 | 9/1973 | Spaulding | 329/358 X |
| 4,509,208 | 4/1985 | Sogo et al. | 455/327 X |
| 4,603,436 | 7/1986 | Butler | 455/319 |
| 4,804,931 | 2/1989 | Hulick | 332/163 |

OTHER PUBLICATIONS

"A GaAs MESFET Mixer with Very Low Intermodulation", IEEE Trans., Microwave Theory Tech., vol. MTT-35, No. 4, Apr. 1987, pp. 425-429, by S. A. Maas.
"2 to 8 GHz Double Balance MESFET Mixer with +30 dBm Input 3rd Order Intercept", IEEE MIT-S Int. Microwave Symposium Digest, vol. 11, 1988, pp. 1097-1100, by S. Weiner, D. Neuf & S. Spohrer.

Primary Examiner—Siegfried H. Grimm
Attorney, Agent, or Firm—Alan T. McCollom

[57] ABSTRACT

A method and apparatus for modulating or demodulating a radio frequency (RF) signal which incorporates a pair of quadrature couplers. In demodulating an RF signal, an LO signal and the RF signal are each phase shifted −90 degrees by the couplers. The RF and LO signals are mixed as are the phase-shifted RF and LO signals. Each mixed signal is low-pass filtered and the filtered signals are added thereby producing an intermediate frequency signal.

9 Claims, 3 Drawing Sheets

DUAL QUADRATURE FREQUENCY CONVERTER

BACKGROUND OF THE INVENTION

1. Field of the Invention

The present invention relates to frequency converters and more particularly to such converters which utilize a local oscillator signal and a phase-shifted local oscillator signal.

2. Description of the Related Art

A frequency converter is a circuit which generates a useful output frequency which is the sum or difference of the input frequency and the frequency of another signal, usually derived from a local oscillator. A frequency converter can be used to demodulate a radio frequency signal, such a circuit being sometimes referred to as a mixer. One application for a mixer is as a down-converter of a radio frequency signal from an earth-orbiting satellite. Such converters produce an intermediate-frequency signal containing information of interest by demodulating the radio-frequency signal from the satellite.

One prior art mixer is disclosed in S.A. Maas, "A GaAs MESFET Mixer With Very Low Intermodulation", IEEE Trans., Microwave Theory Tech., Vol. MTT-35, No. 4, April 1987, pp. 425-429. The Maas reference utilizes a field-effect (FET) transistor as a mixer and relies upon filter rejection to achieve isolation of the radio frequency (RF) and local oscillator (LO) signals. So doing requires use of an LO signal which is substantially separated in frequency from the RF signal.

Another prior art mixer is disclosed in S. Weiner, D. Neuf, S. Spohrer, "2 to 8 GHz Double Balanced MESFET Mixer With +30 dBm Input $3^{rd}$ Order Intercept", IEEE MTT-S Int. Microwave Symposium Digest, Vol. 11, 1988, pp. 1097-1100. The Weiner et al. mixer uses two 180 degree baluns. This approach provides good isolation between the LO and RF stages but does not inherently provide good port return loss. In addition, the baluns are almost impossible to implement in a monolithic microwave integrated circuit (MMIC).

SUMMARY OF THE INVENTION

The present invention comprises a method and apparatus for demodulating a radio-frequency signal comprising a local oscillator and means for phase-shifting the local oscillator signal by 90 degrees. Means are also provided for phase-shifting the radio-frequency signal by 90 degrees. A first mixer mixes the local oscillator and radio-frequency signals and a second mixer mixes the signals produced by the phase-shifting means. The mixed signals are low-pass filtered and thereafter added.

In another aspect of the present invention a method and apparatus using a local oscillator signal and an intermediate-frequency input signal to produce a modulated radio-frequency output signal is provided. Also provided are methods for minimizing the input return loss characteristics of a frequency converter and for enhancing the LO to RF isolation characteristics of the frequency converter.

It is a general object of the present invention to provide a frequency converter method and apparatus which overcomes the above-enumerated disadvantage inherent in prior art methods and apparatus.

It is a more specific object of the present invention to provide such a method and apparatus in which a local oscillator and a radio-frequency signal have minimal input reflected signals.

It is another specific object of the present invention to provide such a method and apparatus having a high degree of LO to RF isolation.

It is another object of the present invention to provide such a method and apparatus for generating a modulated radio-frequency signal in which input reflected signals are minimized.

These and other objects and advantages of the present invention will become more fully apparent as the following detailed description is read in view of the accompanying drawings.

DETAILED DESCRIPTION OF THE PREFERRED EMBODIMENTS

Figure 1:
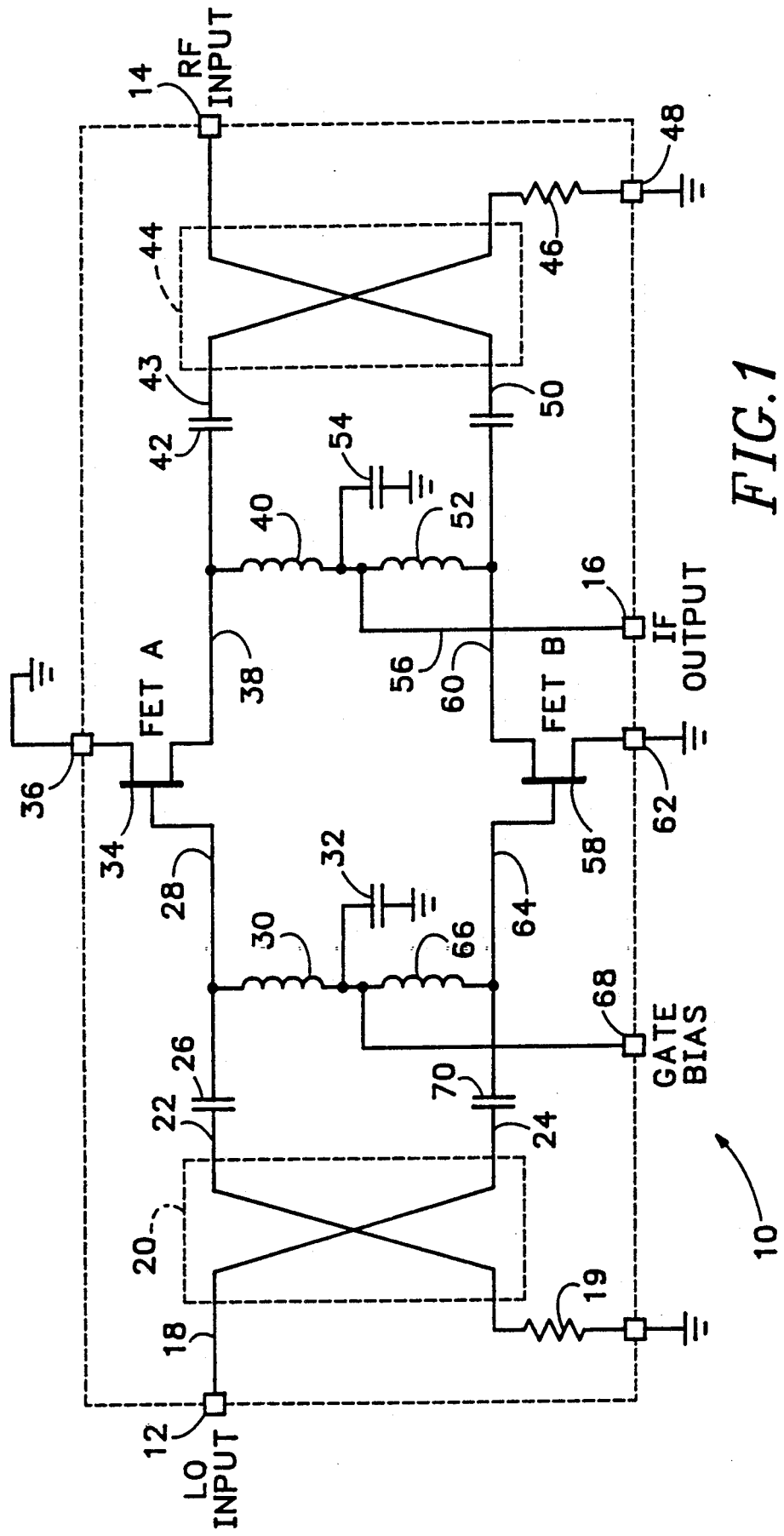
FIG. 1 is a schematic of a preferred circuit constructed in accordance with the present invention.

Turning attention now to FIG. 1, indicated generally at 10 is a frequency converter which is constructed in accordance with the present invention. Converter 10 includes a local oscillator (LO) input terminal 12, a radio-frequency (RF) input terminal 14 and an intermediate-frequency (IF) output terminal 16. In the present embodiment of the invention, converter 10 is implemented in a monolithic microwave integrated circuit (MMIC) using conventional MMIC techniques.

Input terminal 12 is applied to a conductor 18 which in turn is applied to an input of a Lange coupler 20. A second input terminal is grounded as shown via resistor 19. Coupler 20 is a conventional Lange type quadrature coupler having a pair of outputs connected to conductors 22, 24. A signal applied to conductor 18 appears on conductor 22 $-3$ dB relative to the signal on conductor 18 but in phase therewith. This signal is said to be transmitted along the coupled path of coupler 20. A signal also appears on conductor 24 $-3$ dB relative to that appearing on conductor 18 and, in addition, is $-90$ degrees phase shifted relative to the signal on conductor 22. This signal is said to be transmitted along the direct path of the coupler. Coupler 20 has a bandwidth of approximately one octave.

Conductor 22 is connected to a capacitor 26 which in turn is connected to a conductor 28. Conductor 28 is electrically connected to an inductor 30 which has its other end tied to ground via capacitor 32. Also connected to conductor 28 is a field-effect (FET) transistor 34, such being referred to herein as a mixer. The gate of FET 34 is connected to conductor 28 while the source thereof is connected to a ground terminal 36 with the drain being connected to a conductor 38. Conductor 38 is connected to an inductor 40 and a capacitor 42 which has the other side thereof connected to an output of a second Lange coupler 44 via conductor 43.

An input signal, which is described hereinafter, is applied to the Lange coupler at input terminal 14 with the other input terminal being terminated via resistor 46 to ground. Coupler 44 is substantially identical to coupler 20 and operates in the same fashion. The −90 degree phase-shifted output of coupler 44 appears on conductor 50 with the 0 degree phase-shifted output appearing on conductor 43. An inductor 52 is connected to ground via capacitor 54 with the juncture of inductors 40, 52 being applied via conductor 56 to intermediate-frequency (IF) output terminal 16.

A second FET 58 is substantially identical to FET 34 and has its drain connected to a conductor 60, its source connected to a grounded terminal 62 and its gate connected to a conductor 64.

It is to be appreciated that since FETS 34, 58 are produced with MMIC techniques, they are substantially identical to each other and thus have substantially identical reflection coefficients.

Finishing now the description of the circuit of FIG. 1, an inductor 66 has one end connected to the juncture of inductor 30 and capacitor 32 with its other end being connected to conductor 64. The junctures of inductors 30, 66 are also connected to a gate bias terminal 68 which, as will be described hereinafter, provides a connection point for a DC biasing voltage which is provided to FETs 34, 58. A capacitor 70 connects conductor 24 to conductor 64.

OPERATION

When the circuit of FIG. 1 is used to demodulate an RF signal, a conventional local oscillator (not shown) has its output connected to terminal 12 for applying an LO signal which is typically above 2 gigahertz (GHz). In this MMIC version the LO signal is between 10 and 14 GHz. A modulated RF signal is applied to terminal 14. Such a signal is typically received by an antenna and is applied to terminal 14 via antenna leads. A suitable DC bias signal is applied to terminal 68 for biasing the gates of FETs 34, 58. A person having ordinary skill in the art can select an appropriate bias level for effecting operation of the circuit as herein described. Circuit 10 is especially suitable for serving as a down-converter for a communications receiver.

The LO signal applied to terminal 12 is a cosine function. The signal appearing on conductor 22 is connected to the coupled path through coupler 20. The signal appearing on conductor 24, which is connected to the direct path through coupler 20, is also a cosine function but follows the signal on conductor 22 by 90 degrees due to the quadrature phase-shifting of the coupler. Capacitor 26 passes the signal from coupler 20 to conductor 28 while isolating the DC bias signal on terminal 68 from coupler 20 and the local oscillator. Similarly, capacitor 70 passes the phase-shifted signal from the coupler to conductor 64 and also isolates the bias signal.

The DC bias signal appearing on terminal 68 is passed by inductors 30, 66 to conductors 28, 64 respectively and thus to the gates of FETs 34, 58 for appropriately biasing the same. At the same time, inductors 30, 66 cause the signals on conductors 28, 64 which were passed from the coupler via capacitors 26, 70 to be passed to the gates of the FETs because currents at those frequencies are not conducted by the inductors. The gate of FET 34 is thus driven at the LO frequency while the gate of FET 58 is driven at that frequency 90 degrees behind the gate of FET 34. Such driving action periodically changes the channel resistance of the FETs between approximately 5 ohms and approximately 1,000 ohms. The phase-shifting action of coupler 20 is illustrated schematically in FIG. 2.

Looking now at the action of coupler 44 on the RF input signal at terminal 14, the coupled output of coupler 44 is applied to conductor 43 with the direct output being applied to conductor 50 but lagging that of the coupled output by 90 degrees. Capacitors 42, 50 pass the high-frequency signals appearing on conductors 43, 50 to conductors 38, 60. The signal waveform appearing on conductor 38 can be represented as a Fourier series. Considering only the fundamental components of the series, then:

$$A(t) = r_A(t) * COS(\omega Lt) \tag{1}$$

In equation 1, A (t) is the signal appearing on conductor 38, $r_A(t)$ is the RF component of the signal and $COS(\omega Lt)$ is the LO component, where $\omega_L$ is the radian frequency of the local oscillator. FET 34 mixes, i.e., multiplies the RF and LO components with the product appearing on conductor 38.

Similarly, the signal on conductor 60 can be represented as follows:

$$B(t) = r_B(t) * COS(\omega_L t - 90°) \tag{2}$$

In equation 2 $r_B(t)$ is that portion of the signal attributable to the RF input signal while $COS(\omega_L t - 90°)$ is that portion attributable to the LO signal.

It can be assumed that the RF signal equals $COS(\omega_R T)$ where $\omega R$ is the radian frequency of the RF signal appearing of terminal 14. The RF components on conductors 38, 60 are as follows:

$$r_A(t) = COS(\omega_R t) \tag{3}$$

$$r_B(t) = COS(\omega_R t - 90°) \tag{4}$$

Substituting equations 3 and 4 into equations 1 and 2, respectively, and applying trigonometric equivalents, yields the following:

$$\begin{aligned}A(t) = COS(\omega_R t) * \\ COS(\omega_L t) = \tfrac{1}{2}[COS(\omega_R + \omega_L)t + (\omega_R - \omega L)t]\end{aligned} \tag{5}$$

$$\begin{aligned}B(t) = COS(\omega_R t - 90°) * \\ COS(\omega_L t - 90°) = \tfrac{1}{2}[COS\{(\omega_R + \omega_L)t - 180°\} \\ + COS(\omega_R - \omega_L)t]\end{aligned} \tag{6}$$

Inductor 40 prevents passage of the high frequency component of equation 5, $(COS(\omega_R + \omega_L)t)$, to IF output terminal 16 while permitting passage of the much lower frequency component, $(COS(\omega_R - \omega_L)t)$, to the IF output terminal. Similarly, inductor 52 prevents passage of the high frequency component of equation 6, $([COS(\omega_R + \omega_L)t - 180°])$, while passing the much lower IF frequency component, $(COS(\omega_R - \omega_L)t)$, which sums at the juncture of inductors 40, 52 with the IF frequency component of equation 5.

The signal thus appearing on IF terminal 16 is the demodulated RF signal described by equation 7.

$$IF = COS(\omega_R - \omega_L)t \tag{7}$$

Figure 2:
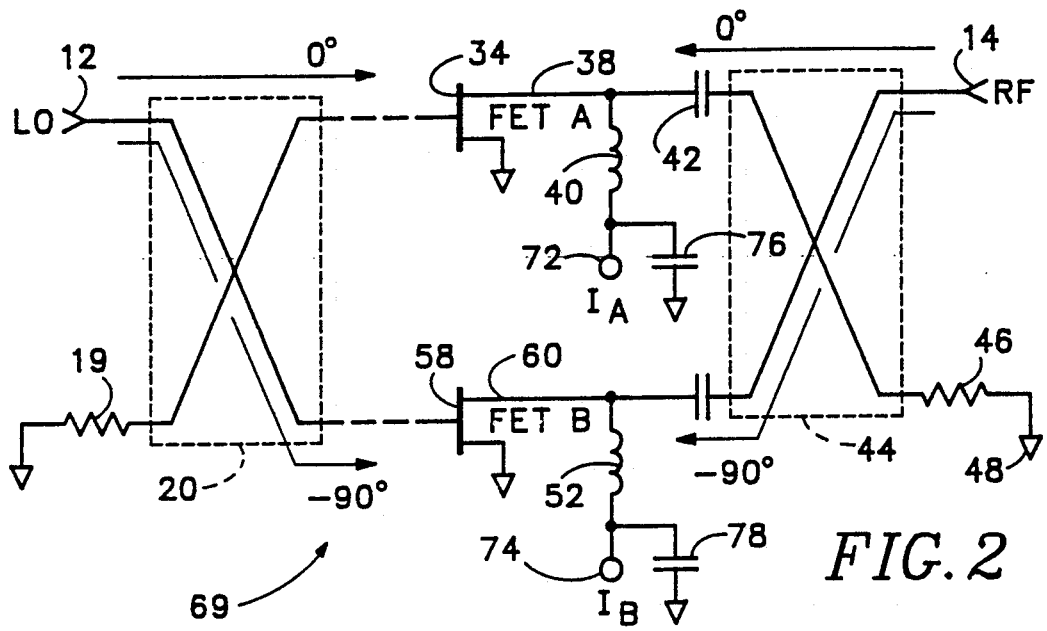
FIG. 2 is a simplified and slightly-modified version of the schematic shown in FIG. 1. This figure illustrates the relative phases of the LO and RF signals used in the first and second mixing circuits.

This mixing action is illustrated schematically in the converter circuit indicated generally at 69 in FIG. 2. Converter 69 is a slightly modified version of converter 10 in which inductors 40, 52 are connected to separate IF terminals 72, 74 rather than being connected to a common IF terminal 16 as in FIG. 1. Also, separate capacitors 76, 78 are provided for directing high frequency components of the signals appearing on conductor 38, 60 which may have passed through inductors 40, 52, respectively, to ground. The phase-shifting action of quadrature couplers 20, 44 which is illustrated in FIG. 2 operates the same for the embodiments of FIGS. 1 and 2.

Figure 3:
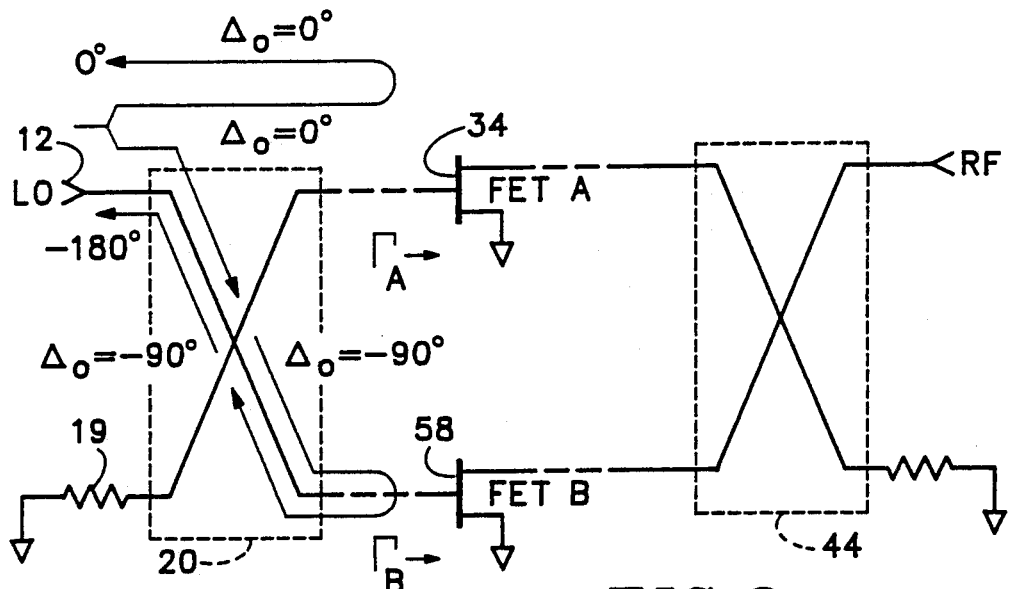
FIG. 3 is a simplified schematic illustrating the input return loss characteristics of the converter.

FIG. 3 illustrates the manner in which coupler 20 provides a good return loss. Since, in the preferred embodiment, the circuit is implemented monolithically, the reflection coefficients $\Gamma_A$ and $\Gamma_B$, for FETs 34, 58, respectively, are substantially equal. Thus, signals reflected from each of the FETs retain the quadrature (90° phase-shifted) relationship. The signal reflected from FET 34 travels back through the coupler via the coupled path which, as will be recalled, does not phase shift the signal passing therethrough.

The signal reflected from FET 58, however, passes along the direct path of the coupler which delayed the phase of the input signal passing therethrough by 90°. Similarly, the reflected signal is shifted or delayed by an additional 90° on its return through the coupler. The signal reflected from FET 58 which appears on terminal 12 is thus 180° delayed relative to the signal reflected from FET 34 appearing on terminal 12. As will be recalled, the LO signal applied to terminal 12 is a cosine function and thus, the reflected signals, being substantially equal in magnitude with one delayed 180° in phase from the other, substantially cancel each other. Return losses greater than 10 dB are realized over octave bandwidths using Lange couplers as shown and described herein.

Figure 4:
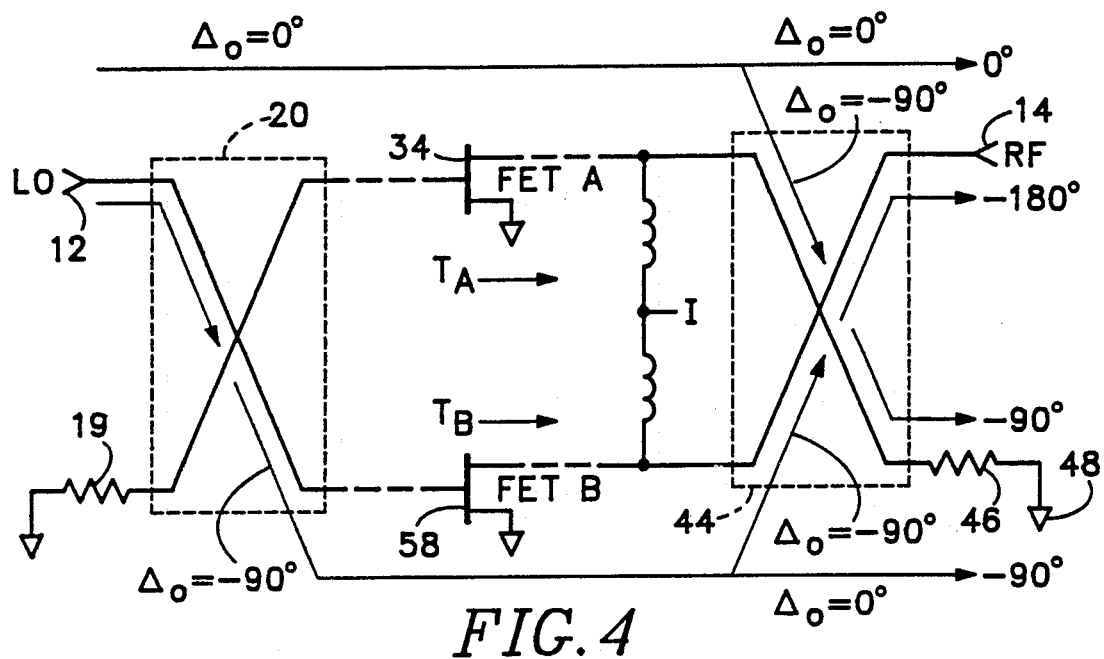
FIG. 4 is a simplified schematic illustrating the LO to RF isolation characteristics of the converter.

FIG. 4 is a schematic illustrating the manner in which the LO signal is isolated from RF terminal 14. Since the FETs have identical characteristics due to the MMIC fabrication, the transmission coefficients $T_A$ and $T_B$, for FETs 34, 58, respectively, are substantially equal. Forward phase-shift and attenuation of the signal which leaks through each FET is thus substantially identical. The path from LO frequency terminal 12 through FET 58 to RF terminal 14 induces a total of 180° of differential phase-shift relative to the path from LO terminal 12 through FET 34 to RF terminal 14. This is again caused by the action of quadrature couplers 20, 44 with a signal from LO terminal 12 being delayed 90° by the direct path in coupler 20 and an additional 90° by the direct path in coupler 44. The signal leaked through FET 34, on the other hand, travels via the coupled paths in each of couplers 20 and 44 and thus is not phase shifted. As the signals leaked through both couplers and both FETs are substantially equal in magnitude with one signal being 180° out of phase with the other, these cosine function signals cancel each other at RF terminal 14. LO terminal to RF terminal isolation is thus achieved without the use of band-reject filters. This allows the LO and RF frequencies to be substantially equal to each other and therefore allows the IF frequency appearing on terminal 16 to go to DC.

Figure 5:
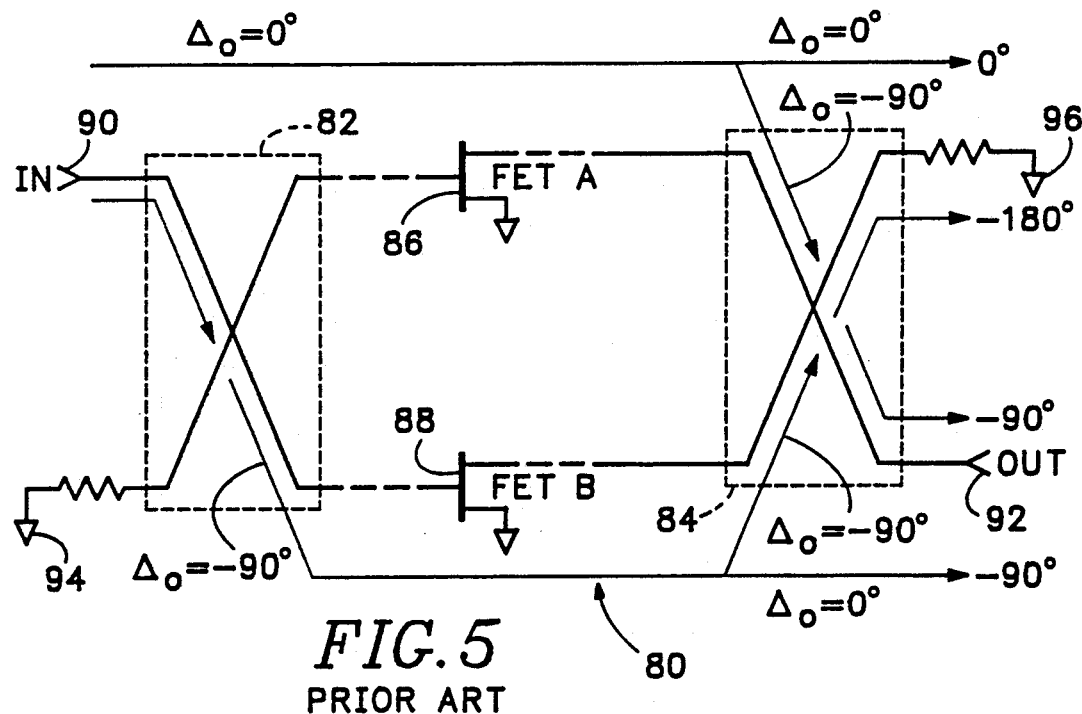
FIG. 5 is a simplified schematic of a known amplifier which uses quadrature couplers.

Turning attention to FIG. 5, a prior art balanced amplifier circuit is indicated generally, in schematic form, at 80. Amplifier circuit 80 includes a pair of quadrature couplers 82, 84 and a pair of FETs 86, 88 connected as shown. An input terminal 90 receives a signal for amplification by amplifiers 86, 88 with the amplified signal being applied to an output terminal 92. Terminals 94, 96 are terminated to ground. Prior art circuit 80 has been implemented in MMIC form among others.

In operation, circuit 80 provides advantageous return loss in the same fashion as illustrated in FIG. 3. Since circuit 80 is an amplifier, the input signal at terminal 90 is not only transmitted through FETs 86, 88 it is amplified thereby. This contrasts with the need to isolate the LO and RF terminals of the converter circuits of the preferred embodiments of the present invention. Thus, in the amplifier circuit of FIG. 5, the signal is phase-shifted by each of couplers 82, 84 and applied in-phase to output terminal 92 and thus sum to produce the amplified signal. The signal which is phase delayed 90° by coupler 82 and again by coupler 84 for a total delay of 180° is applied to grounded terminal 96. Also applied to terminal 96 is the signal passed by both couplers without any phase-shifting thus terminating the signals which cancel each other to ground.

Consideration will now be given to the manner in which converter 69 in FIG. 2 can be used as a frequency converter for generating a modulated RF signal. An LO signal is applied to terminal 12 of converter 69. The LO signal modulates an IF signal present on conductors 38, 60. For the modulated IF signals to add in-phase at terminal 14, separate IF signals must be applied to IF terminals 72, 74 with those signals being 180° out of phase.

Such signals are generated in a known manner by applying an IF source to a transformer (not shown) or to a single-ended to differential converter (also not shown). As described above, the signal waveforms appearing on conductors 38, 60 can be represented as Fourier series. Considering only the fundamental components of the series, then:

$$A(t) = I_A(t) * \cos(\omega_L t) \qquad (8)$$

and $$B(t) = I_B(t) * \cos(\omega_L t - 90) \qquad (9)$$

$I_A(t)$ and $I_B(t)$ are the IF components appearing on conductors 38, 60 respectively. The differential IF components on conductors 38, 60 can be represented as:

$$I_A(t) = \cos(\omega_I t + 90) \qquad (10)$$

and $$I_B(t) = \cos(\omega_I t - 90), \qquad (11)$$

respectively.

Substituting equations 10 and 11 into 8 and 9, respectively, and applying trigonometric equivalents yields the following:

$$A(t) = \cos(\omega_I t + 90) * \cos(\omega_L t) = \qquad (12)$$
$$(\tfrac{1}{2})[\cos\{(\omega_I + \omega_L)t + 90\} + \cos((\omega_I - \omega_L)t + 90]$$

$$B(t) = \cos(\omega_I t - 90) * \cos(\omega_L t - 90) = \qquad (13)$$
$$(\tfrac{1}{2})[\cos((\omega_I + \omega_L)t - 180) + \cos((\omega_I - \omega_L)t - 180]$$

Due to the action of coupler 44, A(t) is not phase shifted as it travels from conductor 48 to terminal 14; however, B(t) is phase-shifted −90° as it travels from conductor 60 to terminal 14. Assuming the difference frequency component, $(\omega_I - \omega_L)$, is eliminated by the action of inductor 40 and capacitor 42, the resultant signal at terminal 14 due to A(t) and B(t) is:

$$\begin{aligned} R(t) &= (\tfrac{1}{2})\,[\cos(\omega_I + \omega_L)t + 90) + (\tfrac{1}{2}) \\ &\quad [\cos((\omega_I + \omega_L)t - 270] \\ &= \cos((\omega_I + \omega_L)t + 90) \end{aligned} \qquad (14)$$

Equation 14 represents a modulated RF signal generated from the original IF signal up-converted, i.e., modulated, with the LO signal at terminal 12. Just as the modulated IF signals on conductors 38, 60 add constructively at terminal 14, any leakage of these IF signals to terminal 12 will behave likewise. There is no inherent IF to LO isolation benefit offered by the differential nature of the If signals or coupler 20. There is a −3 dB benefit in IF to RF isolation provided by the differential IF and quadrature coupler 44.

As with converter 10 in FIG. 1, the LO to RF isolation of converter 69 is enhanced by the quadrature couplers at the LO and RF ports. This is desirable since there may be little frequency separation between the LO and RF signals, thus making it difficult to enhance isolation by using filtering. Also, the LO signal is generally larger than the IF signal.

I claim all modifications coming within the spirit and scope of the accompany claims.

I claim:

1. Apparatus for demodulating a radio frequency signal comprising:
   a first quadrature coupler having an input, a first output and a second output, said first output being connected to said input via a coupled path and said second output being connected to said input via a direct path;
   means for generating a local oscillator signal on said coupler input;
   a second quadrature coupler having an input, a first output and a second output, said first output being connected to said input via a coupled path and said second output being connected to said input via a direct path;
   means for applying the radio frequency signal to said second coupler input;
   a first mixer for mixing the signals appearing on said first outputs;
   a second mixer for mixing the signals appearing on said second outputs;
   means for filtering the signals so mixed; and
   means for adding the filtered signals.

2. The apparatus of claim 1 wherein said first and second mixers each comprise a field effect transistor.

3. The apparatus of claim 2 wherein said apparatus is implemented in a monolithic microwave circuit.

4. The apparatus of claim 1 wherein said each of said coupler comprises a Lange coupler.

5. The apparatus of claim 1 wherein said quadrature couplers each include a second input, said first output being connected to said second input via a direct path and said second output being connected to said second input via a coupled path, said second input being terminated to ground.

6. A method for demodulating a radio frequency signal comprising the steps of:
   generating a local oscillator signal;
   applying the local oscillator signal to the input of a first quadrature coupler of the type having a coupled output and a direct output;
   applying the radio frequency signal to the input of a second quadrature coupler of the type having a coupled output and a direct output;
   mixing the signals appearing on said coupled outputs;
   mixing the signals appearing on said direct outputs;
   low-pas filtering each mixed signal; and
   adding the mixed signals.

7. The method of claim 6 wherein the step of mixing the signals appearing on said coupled outputs comprises the step of applying the coupled output of said first coupler to the gate of a field effect transistor and applying the coupled output of said second coupler to one side of said transistor.

8. The method of claim 7 wherein the step of mixing the signals appearing on said direct outputs comprises the step of applying the direct output of said first coupler to the gate of a field effect transistor and applying the direct output of said second coupler to one side of said transistor.

9. The method of claim 8 wherein said method further includes the step of implementing said couplers and said field effect transistors in a monolithic microwave circuit.

* * * * *